(12) United States Patent
Gollier (10) Patent No.: US 7,715,453 B2
(45) Date of Patent: May 11, 2010

(54) WAVELENGTH CONTROL IN PHASE REGION OF SEMICONDUCTOR LASERS

(75) Inventor: Jacques Gollier, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 372 days.

(21) Appl. No.: 11/986,139

(22) Filed: Nov. 20, 2007

(65) Prior Publication Data

US 2009/0129414 A1 May 21, 2009

(51) Int. Cl.
*H01S 3/10* (2006.01)
(52) U.S. Cl. .......................................... 372/28; 372/32
(58) Field of Classification Search .................. 372/22, 372/37, 29.015, 29.022; 359/188
See application file for complete search history.

(56) References Cited

U.S. PATENT DOCUMENTS

| | | | | |
|---|---|---|---|---|
| 5,473,625 | A | 12/1995 | Hansen et al. ................. | 372/96 |
| 6,031,860 | A * | 2/2000 | Nitta et al. ................. | 372/50.11 |
| 6,058,128 | A | 5/2000 | Ventrudo ..................... | 372/96 |
| 6,069,904 | A | 5/2000 | Kitaoka et al. ................ | 372/32 |
| 6,215,809 | B1 | 4/2001 | Ziari et al. .................... | 372/96 |
| 6,222,861 | B1 | 4/2001 | Kuo et al. ..................... | 372/20 |
| 6,331,908 | B1 * | 12/2001 | Adams et al. ................. | 398/200 |
| 6,389,046 | B1 | 5/2002 | Stayt, Jr. et al. ........... | 372/29.02 |
| 6,560,253 | B1 | 5/2003 | Munks et al. ................. | 372/32 |
| 6,738,398 | B2 * | 5/2004 | Hirata et al. .................. | 372/32 |
| 7,010,006 | B2 | 3/2006 | Kasazumi et al. ........ | 372/29.02 |
| 7,103,079 | B2 * | 9/2006 | McInerney et al. ....... | 372/38.02 |
| 7,257,142 | B2 | 8/2007 | Sochava et al. ............ | 372/50.1 |
| 2004/0086012 | A1 | 5/2004 | Kitaoka et al. ................ | 372/43 |
| 2004/0264525 | A1 | 12/2004 | Senga et al. ............... | 372/38.1 |

(Continued)

FOREIGN PATENT DOCUMENTS

JP        2007043068        2/2007

(Continued)

OTHER PUBLICATIONS

Y. Kitaoka, "Wavelength Stabilization of a distributed Bragg reflector laser diode by use of complementary current injection", Optics Letters/vol. 28, No. 11/Jun. 1, 203 pp. 914-916.

*Primary Examiner*—Minsun Harvey
*Assistant Examiner*—Tuan N. Nguyen
(74) *Attorney, Agent, or Firm*—Gregory V. Bean; Dinsmore & Shohl, LLP (57) ABSTRACT

Particular embodiments of the present invention relate generally to semiconductor lasers and laser scanning systems and, more particularly, to schemes for controlling semiconductor lasers. According to one embodiment of the present invention, a laser is configured for optical emission of encoded data. At least one parameter of the optical emission is a function of a drive current $I_{GAIN}$ injected into the gain section of the semiconductor laser and one or more additional drive currents $I/V_{PHASE}$, $I/V_{DBR}$. Mode selection in the semiconductor laser is altered by applying a phase shifting signal $I/V_\Phi$ to the phase section that is synched with a wavelength recovery portions in drive current $I_{GAIN}$ such that a plurality of cavity modes are shifted by one half of the free spectral range at each wavelength recovery portion. In this manner, patterned variations in the wavelength or intensity profile of the laser can be disrupted to disguise patterned flaws that would otherwise be readily noticeable in the output of the laser.

24 Claims, 5 Drawing Sheets

U.S. PATENT DOCUMENTS

| | | | |
|---|---|---|---|
| 2006/0120416 A1* | 6/2006 | Hu et al. | 372/26 |
| 2006/0193354 A1 | 8/2006 | Rosenblatt | 372/29.023 |
| 2008/0089373 A1 | 4/2008 | Bhatia et al. | 372/38.02 |

FOREIGN PATENT DOCUMENTS

| | | |
|---|---|---|
| WO | WO99/43060 | 8/1999 |
| WO | WO2008/048474 | 4/2008 |

\* cited by examiner

WAVELENGTH CONTROL IN PHASE REGION OF SEMICONDUCTOR LASERS

BACKGROUND OF THE INVENTION

The present invention relates generally to semiconductor lasers, laser controllers, laser projection systems, and other optical systems incorporating semiconductor lasers. More particularly, some embodiments of the present invention relate to schemes for managing laser wavelength variations in semiconductor lasers. Other embodiments of the present invention relate to schemes for minimizing systematic wavelength variations in the output of a wavelength conversion device optically coupled to a semiconductor laser, and schemes for disrupting the temperature evolution signature within a scanned laser image of a laser projection system.

SUMMARY OF THE INVENTION

The present invention relates generally to semiconductor lasers, which may be configured in a variety of ways. For example and by way of illustration, not limitation, short wavelength sources can be configured for high-speed modulation by combining a single-wavelength semiconductor laser, such as a distributed feedback (DFB) laser, a distributed Bragg reflector (DBR) laser, a vertical cavity surface-emitting laser (VCSEL), a vertical external cavity surface-emitting laser (VECSEL) or a Fabry-Perot laser with a light wavelength conversion device, such as a second harmonic generation (SHG) crystal. The SHG crystal can be configured to generate higher harmonic waves of the fundamental laser signal by tuning, for example, a 1060 nm DBR or DFB laser to the spectral center of a SHG crystal, which converts the wavelength to 530 nm. However, the wavelength conversion efficiency of an SHG crystal, such as MgO-doped periodically poled lithium niobate (PPLN), is strongly dependent on the wavelength matching between the laser diode and the SHG device. As will be appreciated by those familiar with laser design, DFB lasers are resonant-cavity lasers using grids or similar structures etched into the semiconductor material as a reflective medium. DBR lasers are lasers in which the etched grating is physically separated from the electronic pumping area of the semiconductor laser. SHG crystals use second harmonic generation properties of non-linear crystals to frequency double laser radiation.

The bandwidth of a PPLN SHG device is often very small—for a typical PPLN SHG wavelength conversion device, the full width half maximum (FWHM) wavelength conversion bandwidth is only in the 0.16 to 0.2 nm range and mostly depends on the length of the crystal. Mode hopping and uncontrolled large wavelength variations within the laser cavity can cause the output wavelength of a semiconductor laser to move outside of this allowable bandwidth during operation. Once the semiconductor laser wavelength deviates outside the wavelength conversion bandwidth of the PPLN SHG device, the output power of the conversion device at the target wavelength drops. In laser projection systems, for example, mode hops are particularly problematic because they can generate instantaneous changes in power that will be readily visible as defects at specific locations in the image. These visible defects typically manifest themselves as organized, patterned image defects across the image because the generated image is simply the signature of the temperature evolution of the different sections of the laser.

Given the challenges associated with wavelength matching and stabilization in developing semiconductor laser sources, the present inventors have recognized beneficial schemes for managing laser wavelength variations in semiconductor lasers. The present inventors have also recognized beneficial schemes for managing systematic wavelength variations in the output of a wavelength conversion device optically coupled to a semiconductor laser by disrupting the unfavorable temperature evolution signature of the laser.

The present inventors have recognized that although the concepts of the present invention are described primarily in the context of DBR lasers, it is contemplated that the control schemes discussed herein will also have utility in a variety of types of semiconductor lasers, including but not limited to DFB lasers, Fabry-Perot lasers, and many types of external cavity lasers. It is also noted that, particular embodiments of the present invention relate to wavelength stabilization in laser sources in general, without regard to whether second harmonic generation is utilized in the laser source.

According to one embodiment of the present invention, a method of controlling a semiconductor laser is provided. According to the method, at least one of the sections of the semiconductor laser is modulated to provide image data. For example, and not by way of limitation, in the case of laser projection, the gain current $I_{GAIN}$ can be modulated to generate grey levels in the projected image. This modulation generates some fluctuation of the laser wavelength, which results in a variation of the projected light. In the context of a relatively stationary image, the wavelength fluctuation will repeat itself frame-by-frame, resulting in a systematic and organized image bias that can easily be detected by the human eye. Some embodiments of the present invention manage this issue by utilizing in the laser one or multiple additional signals in such a way that the image bias becomes non-organized and therefore, much harder to detect with human eyes.

According to additional embodiments of the present invention, methods of controlling laser projection systems incorporating semiconductor lasers and laser controllers programmed to execute such methods are provided. More specifically, the method comprises generating at least a portion of a scanned laser image and applying a phase shifting signal $I/V_\Phi$ to the phase section of the laser to periodically shift a plurality of cavity modes between an unshifted state and a shifted state, wherein the unshifted state and the shifted state are separated by approximately one half of the laser cavity free spectral range.

According to another embodiment of the present invention, a method of controlling a laser projection system is provided, the method comprises selecting a wavelength recovery portion periodicity $t_R$ that is incorporated into the drive current $I_{GAIN}$ such that the image line duration $t_L$ is not an integer multiple of the wavelength recovery portion periodicity $t_R$, wherein the wavelength recovery portion does not occur at the same location within the image lines of each frame and systematic image defects are thereby reduced.

According to another embodiment of the present invention, a method of controlling a laser projection system is provided, the method comprises generating at least a portion of a scanned laser image and applying a phase shifting signal $I/V_\Phi$ to the phase section of the laser to periodically shift a plurality of cavity modes between an unshifted state and a shifted state at the initiation of each image line duration $t_L$ or the initiation of each image frame duration $t_F$, wherein the unshifted state and the shifted state are separated by approximately one half of the laser cavity free spectral range.

Although the concepts of the present invention are described primarily in the context of image forming, it is contemplated that various concepts of the present invention may also be applicable to any laser application where repeatable, low frequency fluctuation of the laser wavelength is a problem.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
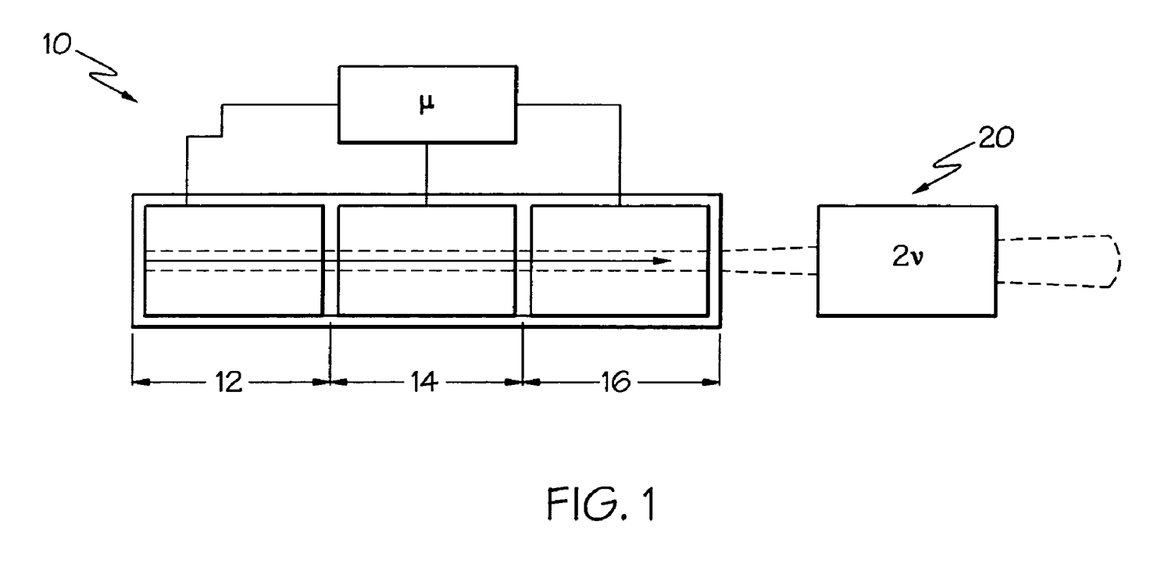
FIG. 1 is a schematic illustration of a DBR or similar type semiconductor laser optically coupled to a light wavelength conversion device.

Although the specific structure of the various types of semiconductor lasers in which the concepts of particular embodiments of the present invention can be incorporated is taught in readily available technical literature relating to the design and fabrication of semiconductor lasers, the concepts of particular embodiments of the present invention may be conveniently illustrated with general reference to a three-section DBR-type semiconductor laser 10 illustrated schematically in FIG. 1. In FIG. 1, the DBR laser 10 is optically coupled to a light wavelength conversion device 20. The light beam emitted by the semiconductor laser 10 can be either directly coupled into the waveguide of the wavelength conversion device 20 or can be coupled through collimating and focusing optics or some other type of suitable optical element or optical system. The wavelength conversion device 20 converts the incident light into higher harmonic waves and outputs the converted signal. This type of configuration is particularly useful in generating shorter wavelength laser beams from longer wavelength semiconductor lasers and can be used, for example, as a visible laser source for laser projection systems.

In the context of laser projection systems, a scanned laser image is generated by scanning an output beam of visible light across an image line that is made up of individual pixels. Each individual image line and pixel is characterized by a duration of $t_L$ and $t_P$, and an image line generation frequency and an image pixel generation frequency, respectively. A plurality of the image lines make up an image frame. These image frames, which have a duration $t_F$ and an image frame generation frequency, are then repeated at a desired frequency to create the scanned laser image that is observed by the viewer.

The DBR laser 10 illustrated schematically in FIG. 1 comprises a wavelength selective section 12, a phase section 14, and a gain section 16. The wavelength selective section 12, which can also be referred to as the DBR section of the laser 10, typically comprises a first order or second order Bragg grating positioned outside the active region of the laser cavity. This section provides wavelength selection, as the grating acts as a mirror whose reflection coefficient depends on the wavelength. The gain section 16 of the DBR laser 10 provides the major optical gain of the laser and the phase section 14 creates an adjustable phase shift between the gain material of the gain section 16 and the reflective material of the wavelength selective section 12. As with the DBR section, the phase section is passive in the sense that it does not provide gain to the laser 10. The effect of injecting a signal into the phase section is to shift the wavelength of the laser cavity modes. The wavelength selective section 12 may be provided in a number of suitable alternative configurations that may or may not employ a Bragg grating.

A microcontroller 30 controls electrical currents that are injected into corresponding sections 12, 14 and 16 of the laser 10. The injected current can be used to alter the operating properties of the laser by, for example, controlling the temperature of one or more of the laser sections, injecting electrical current into a conductively doped semiconductor region defined in the laser substrate, controlling the index of refraction of the wavelength selective and phase sections 12, 14 of the laser 10, controlling optical gain in the gain section 16 of the laser, etc. The DBR sections can be addressed by injecting current into the semiconductor junction, by applying a reverse voltage into the junction or by using heaters located at the proximity of the waveguide.

The wavelength conversion efficiency of the wavelength conversion device 20 illustrated in FIG. 1 is dependent on the wavelength matching between the semiconductor laser 10 and the wavelength conversion device 20. The output power of the higher harmonic light wave generated in the wavelength conversion device 20 drops drastically when the output wavelength of the laser 10 deviates from the wavelength conversion bandwidth of the wavelength conversion device 20. For example, when a semiconductor laser is modulated to produce data, the thermal load varies constantly. The resulting change in laser temperature and lasing wavelength generates a variation of the efficiency of the SHG crystal 20. In the case of a wavelength conversion device 20 in the form of a 12 mm-long PPLN SHG device, a temperature change in the semiconductor laser 10 of about 2° C. will typically be enough to take the output wavelength of the laser 10 outside of the 0.16 nm full width half maximum (FWHM) wavelength conversion bandwidth of the wavelength conversion device 20. When modulating the laser to produce a useful signal, the laser is submitted to fast thermal load variations which creates fast wavelength fluctuations. Particular embodiments of the present invention address this problem by limiting laser wavelength variations to acceptable levels.

Figure 3:
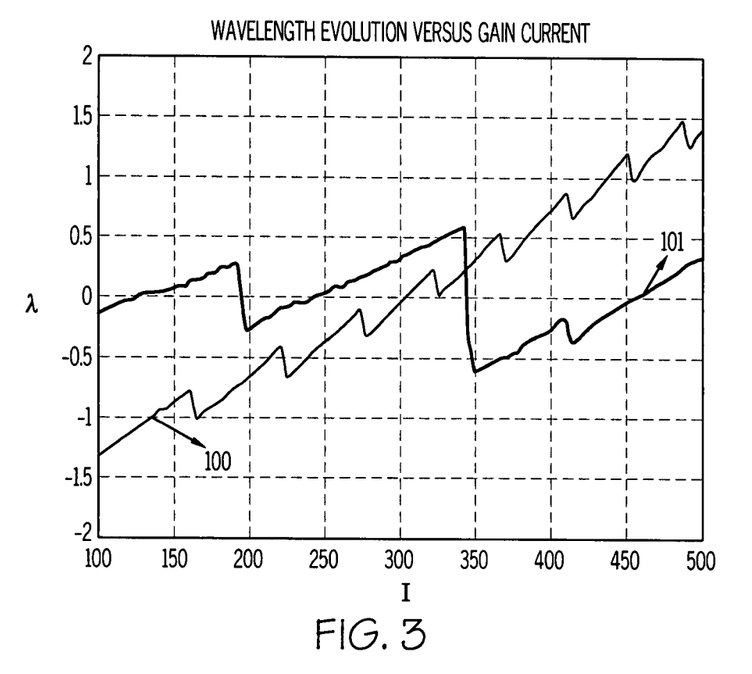
FIGS. 3 and 4 illustrate the evolution of emission wavelength as a function of gain current in a DBR laser.

The present inventors have recognized challenges in stabilizing the emission wavelength of a semiconductor laser because they are commonly subject to wavelength drift and associated cavity mode hopping. For example, and not by way of limitation, FIG. 3 illustrates the evolution of emission wavelength as a function of gain current in a DBR laser. When the gain current increases, the temperature of the gain section also increases. As a consequence, the cavity modes move towards higher wavelengths. The wavelength of the cavity modes move faster than the wavelength of the DBR section. So, the laser reaches a point where a cavity mode of lower wavelength is closer to the maximum of the DBR reflectivity curve. At that point, the mode of lower wavelength has lower loss than the mode that is established and, according to basic principles of laser physics, the laser then automatically jumps to the mode that has lower loss. This behavior is illustrated on the curve 100 of FIG. 3. As is illustrated in FIG. 3, the wavelength slowly increases and includes sudden mode hops whose amplitude is equal to one free spectral range of the laser cavity.

Figure 7:
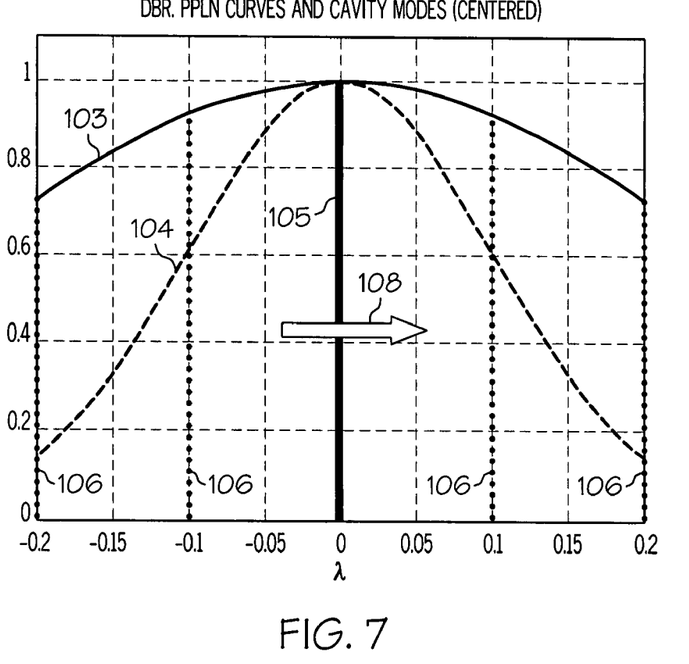
FIGS. 7 and 8 illustrate the thermal drift of cavity modes of a semiconductor laser.
Figure 8:
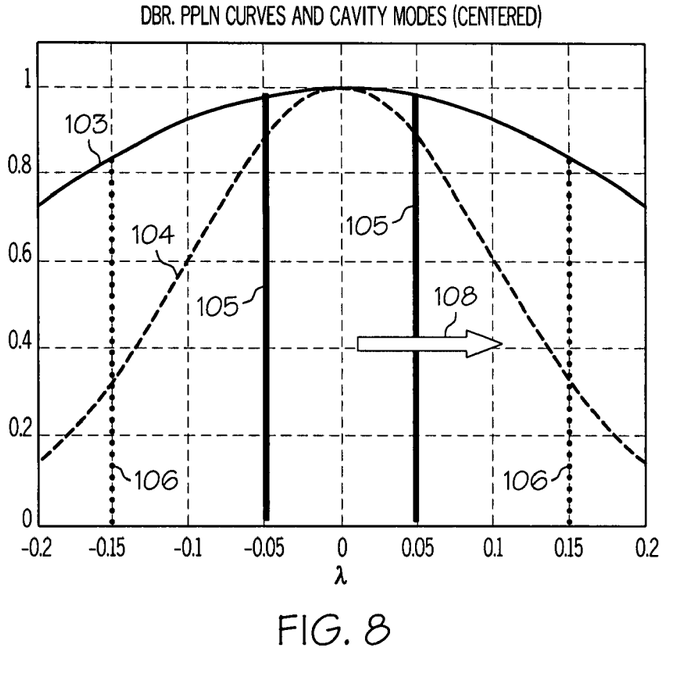

FIGS. 7 and 8 illustrate two potentially extreme scenarios resulting from moving cavity modes. When modulating the gain section, the thermal load applied to the laser is constantly changing over time. As a result, the cavity modes of the laser are constantly moving, the amplitude and direction of that wavelength fluctuation being a function of the signal applied to the laser. On the other hand, the DBR spectral curve is relatively stable because the gain section to DBR section cross talk which corresponds to the DBR heating induced by the gain section current is usually a relatively slow phenomenon. Therefore, during a single frame, the DBR spectral curve does not move while the cavity modes are constantly moving.

FIG. 7 represents a scenario in which the cavity modes 105, 106 are substantially centered over the DBR curve 103. The DBR curve 103 is substantially centered over the PPLN curve 104 in an optimum operating condition. The cavity modes are represented as a series of vertical lines, with the aligned cavity mode 105 centered with the DBR curve 103 and the misaligned cavity modes 104 are not centered on the DBR cure 103. The aligned cavity mode 105 is the cavity mode with the lowest cavity loss, and therefore it is the cavity mode that is preferentially selected when modulating the laser. In the context of a laser projection system, because the aligned mode is centered over the PPLN curve, it will correspond to the brightest area in the image.

FIG. 8 represents a scenario that corresponds to a darker area in an image generated by a laser projection system. Again the DBR curve 103 is substantially centered over the PPLN curve 104. However, the cavity modes have now shifted by one half of a laser free spectral range, as indicated by the arrow in FIG. 8. In this situation, the cavity modes are symmetric with respect to the DBR curve. Therefore, the two closest cavity modes 105 to the DBR maximum have an equal probability of being selected every time the laser is modulated, with the other modes 106 having very little probability of being selected. As a result, this situation will correspond to a darker area in the image because the laser wavelength is not centered anymore over the PPLN curve 104 regardless of which mode is randomly selected.

Although the present invention is not limited to any particular manifestation of the wavelength variations and sudden mode hops, in the context of a laser projection system, these wavelength fluctuations can create smooth intensity variations and the mode hops can create relatively abrupt intensity shifts in the image created by scanning the laser. The particular pattern created in the image by these defects can be a function of a number of factors including, but not limited to, laser temperature, laser free spectral range, the PPLN crystal spectral band pass, the spectral alignment of the laser DBR with respect to the PPLN crystal, etc. Regardless of the nature of the defect pattern, the pattern itself can present a problem in the image because it presents a readily recognizable, systematic structure in the image.

When modulating the laser gain section, the cavity modes are continuously evolving between the two extreme cases of FIGS. 7 and 8, resulting in brighter and darker areas in the image. The shape and location of the resulting image defects are repeatable because the defects are a result of thermal drifts in the laser, which possess exponential functions with multiple time constants. For example, in quasi static images, where the content does not change very much from one frame to another, the way that the laser is heating up for each frame is perfectly repeatable. The consequence is that the image defect will repeat itself on a frame to frame basis, making it very easy to recognize the defects in the image.

As is described in detail below, image defects of this nature can be made harder to detect by applying a phase shifting signal to the phase section of the semiconductor laser. For example, and not by way of limitation, if the phase signal is kept constant for each frame that is generated but changed on a frame per frame basis, the consequence will be that each single frame will have a defect pattern, but the nature of the pattern, i.e., the position of the dark and bright areas in the pattern, will change from frame to frame. As a consequence, the eye will integrate in time all the images so that it will be hard to detect any systematic defect. As a further example, the present invention also contemplates changing the phase signal for each image line or pixel. As a consequence, the organized systematic image defect is disrupted, which makes any image defect much more difficult for the human eye to recognize.

It is also contemplated that the control signal applied to the laser can be completely random or presented in some more elaborate functions. As an example, the control signal can be injected into the phase and/or DBR section of the laser so that it corresponds to half the laser spectral range, effectively inverting the shape of the image defect. This inversion can be introduced on a frame-by-frame, line-by-line, or pixel-by-pixel basis, as is described above.

Referring further to FIG. 3, curve 101 illustrates significantly different emission behavior in a DBR laser. Specifically, a laser having the same general manufacturing parameters as the laser illustrated with reference to curve 100, may exhibit significantly different behavior in the sense that, instead of having mode hops with an amplitude of one laser free spectral range, the laser will exhibit mode hops having up to 6 or more free spectral range amplitudes. For many applications, this large sudden wavelength variation would not be acceptable. For example, in the case of a laser projection system, these large hops would cause sudden intensity jumps in the image from a nominal grey-scale value to a value close to zero. The present inventors have investigated this phenomena, as well as wavelength instability and hysteresis in lasers, and note that these laser emission defects can be attributed to one or more of a variety of factors, including spatial hole burning, spectral hole burning, gain profile broadening, and self induced Bragg gratings. It is contemplated that these factors may lock lasing on the particular cavity mode that has been established in the laser cavity or encourage larger mode hops. Indeed, it appears that once a mode is established, the photons that are inside the cavity at a specific wavelength disturb the laser itself by depleting the carrier density at a specific energy level or by creating a self induced Bragg grating in the cavity.

Figure 4:
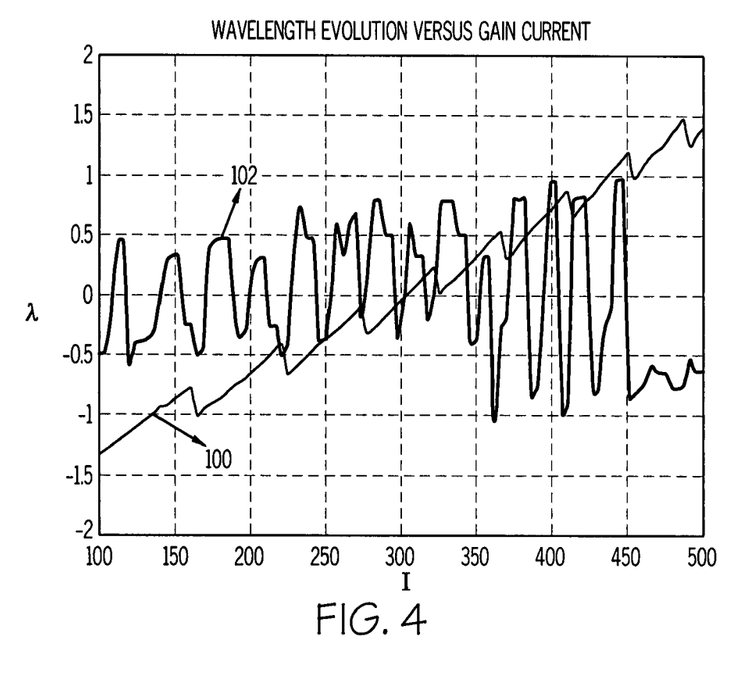

The curve 102 of FIG. 4 illustrates another case of special mode hopping behavior. In the illustrated case, the emission wavelength is unstable because it includes back reflections attributable to a component located outside the laser, a phenomena referred to as the external cavity effect. With the external cavity effect, an external reflection creates a parasitic Fabry-Perot cavity that disturbs the laser cavity and is capable of generating mode hops of very large amplitude. Regardless of the source of unacceptable wavelength drift in a semiconductor laser, particular embodiments of the present invention are directed at managing wavelength fluctuations of the laser.

The present inventors have recognized that the large wavelength fluctuations and associated mode-hopping effect illustrated in FIGS. 3 and 4 is at least partially dependent upon photon density in the laser cavity and can be amplified when having significant external cavity effects. The present inventors have also recognized that the lasing wavelength may jump more than one mode and that this multi-mode jump may be attributable, in whole or in part, to spectral and spatial hole burning and additional lasing phenomena such as external cavity effects.

Regardless of the cause of multi-mode drift in semiconductor lasers, when this phenomenon occurs, the lasing wavelength usually shows abnormal wavelength jumps which are equal to a multiple of the cavity mode spacing. Before a large mode hop occurs, the laser usually shows large continuous wavelength shift. The larger wavelength drift and the abnormal wavelength jump can cause unacceptable noise in a laser signal. For example, if this phenomenon happens systematically in a laser projection system, an example of which is illustrated schematically in FIG. 2, the noise in the projected image will be readily visible to the human eye.

Figure 5:
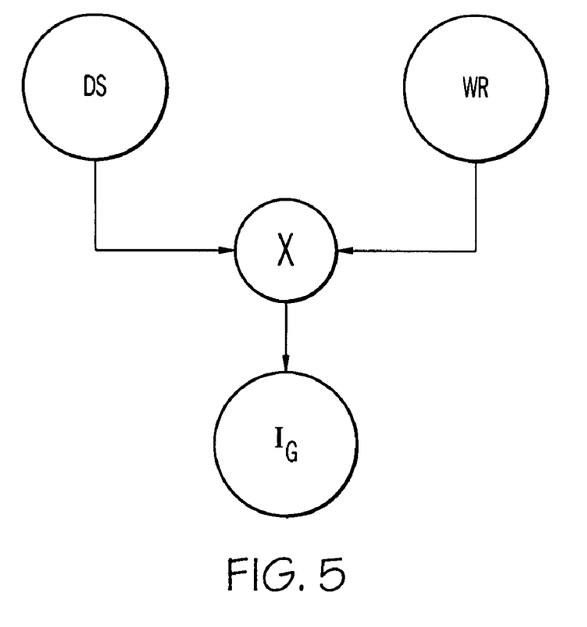
FIG. 5 illustrates a scheme for controlling laser wavelength according to one embodiment of the present invention.
Figure 6:
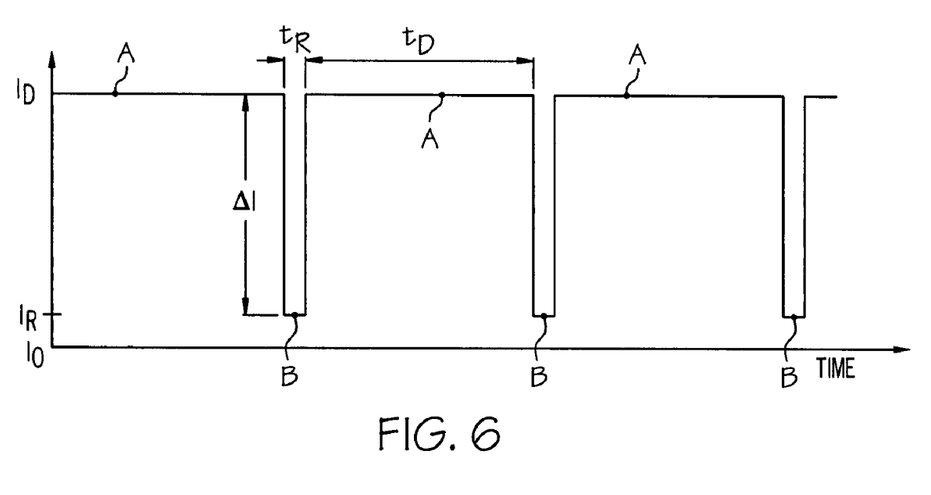
FIG. 6 is a further illustration of the control scheme illustrated in FIG. 5.

As is noted above, particular embodiments of the present invention generally relate to control schemes where a semiconductor laser drive current comprises a drive portion and a wavelength recovery portion. FIGS. 5 and 6 illustrate a scheme for controlling wavelength in a single mode laser signal where the drive portion comprises a data portion that is injected as electrical current into the gain section of the semiconductor laser. Accordingly, in the illustrated embodiment, the drive current comprises respective data portions A and wavelength recovery portions B. Referring specifically to FIG. 5, theses portions of the drive current or gain injection current can be introduced by taking the product of a laser data signal and a suitably configured wavelength recovery signal. For example, and not by way of limitation, the laser data signal may carry image data for projection in a laser projection system. As is illustrated in FIG. 6, the wavelength recovery signal is configured such that the data portion of the gain section drive current, i.e., the gain injection current, comprises a relatively high drive amplitude $I_D$ of relatively long drive duration $t_D$, while the wavelength recovery portion of the drive current comprises a relatively low recovery amplitude $I_R$ of relatively short recovery duration $t_R$. The relatively high drive amplitude $I_D$ of the data portion is sufficient for lasing within the laser cavity at a lasing mode $\lambda_0$. The relatively low recovery amplitude $I_R$ of the wavelength recovery portion of the drive current is distinct from the drive amplitude $I_D$ and is illustrated in FIG. 6 as being $\Delta I$ lower than the drive amplitude $I_D$. The relatively low recovery amplitude $I_R$ may be zero, or a value close to or less than a laser threshold value that will reset the laser.

The drive amplitude $I_D$ and duration $t_D$ of the data portion of the gain section drive current act to produce the optical signal with appropriate power and wavelength, depending of course on the specific application in which it is to be used. The recovery amplitude $I_R$ and the recovery duration $t_R$ are sufficient to decrease photon density within at least a portion of the laser cavity. By decreasing the photon density to a lower value, in many cases close to zero, the various phenomena that cause large wavelength drift, such as spectral hole burning, spatial hole burning, gain profile broadening, or self induced Bragg gratings, disappear. As a consequence, when significant current is re-injected into the gain section at the end of the recovery period, the laser automatically selects the modes that are among the closest to the maximum of the DBR reflectivity curve. Therefore, the wavelength fluctuations can be limited to one laser free spectral range and the multi-cavity mode hops are eliminated, or at least significantly reduced. The resulting gain section drive current, which comprises the data portion and the wavelength recovery portion can be used to minimize wavelength drift and narrow the time-average laser oscillation optical bandwidth of the laser.

Stated differently, the drive amplitude $I_D$ and duration $t_D$ of the data portion of the gain section drive current increase the probability that the lasing wavelength will undergo an unacceptable drift, for example, and not by way of limitation, a change in wavelength that exceeds 0.05 nm. The relatively low recovery amplitude $I_R$ of the density recovery portion of the gain section drive current follows the data portion of the drive current and decreases the probability of an unacceptable wavelength drift. If the recovery portion of the drive current has a sufficient high frequency of occurrence, a lasing cavity mode is shut off before it has accumulated large wavelength drift and a new cavity mode is selected, therefore reducing the large wavelength drift.

In the context of a laser projection system including, for example, a frequency doubled PPLN green laser, without wavelength control according to embodiments of the present invention, the green power emitted by the laser over a single line of the image display will exhibit sudden variations in power due to multiple cavity mode hops. As a result, projected images will have abrupt drops in power with amplitude on the order of 50% and more. However, employing wavelength control schemes according to particular embodiments of the present invention where the drive signal is altered for every pixel, e.g., typically every 40 ns, it is contemplated that the undesired decrease in laser power will be highly mitigated. For example, in one execution of an embodiment of the present invention, residual noise standard deviation in the image was on the order of 8% with the recovery amplitude $I_R$ set to near zero, the recovery duration $t_R$ at about 10 nsec, and the drive duration $t_D$ at about 40 nsec. The image was also observed to have defects with relatively high spatial frequency, which are typically not readily apparent to the naked eye.

Although the recovery amplitude $I_R$ may be zero, it can be any value that is sufficient to eliminate the source of multiple cavity mode hops or otherwise improve the wavelength behavior of the laser. The recovery amplitude $I_R$ of the gain section drive current will be lower than the drive amplitude $I_D$ and can be substantially above zero. The relatively high drive amplitude $I_D$ may be substantially continuous but will often vary in intensity, particularly where the semiconductor laser is incorporated in an image projection system, as is described in further detail below.

Where the laser is configured for optical emission of encoded data, a data signal representing the encoded data is applied to the laser. For example, and not by way of limitation, the data signal may incorporated as an intensity or pulse-width modulated data portion of a drive signal injected into the gain section of the laser. The wavelength recovery operation of particular embodiments of the present invention is executed to be at least partially independent of the data encoded in the data signal. For example, where the drive current is injected into the gain section of the laser, its drive portion may be intensity modulated to encode data. The wavelength recovery portion of the drive current is superimposed on the drive current, independent of the encoded data. Similarly, where the drive portion is pulse-width modulated to encode data, the wavelength recovery portion of the drive current will also be superimposed on the drive current.

The aforementioned superposition may be completely independent of the encoded data or may be applied only where the intensity of the drive current or the duration of the pulse width representing the encoded data reaches a threshold value, in which case it would be partially dependent on the encoded data. Once superimposed, however, the extent of independence of the wavelength recovery portion would need to be sufficient to ensure that sufficient wavelength recovery would be obtained. Stated differently, the wavelength recovery portion of the drive current should dominate the drive current under conditions where the data signal would otherwise prevent wavelength recovery. For example, in the context of a pulse-width modulated data signal, it is contemplated that wavelength recovery may not be needed for relatively short, high amplitude pulse-widths. However, where the encoded data includes relatively long, high amplitude pulse widths, the duty cycle defined by the drive operation and wavelength recovery operation should be sufficient to limit the maximum duration of the high amplitude pulse width to ensure that wavelength recovery can be achieved before unacceptable wavelength drift is observed. For example, it may be preferable to ensure that the maximum duration of the pulse width cannot exceed about 90% of the duration of the duty cycle defined by the drive operation and wavelength recovery operation. In addition, in the context of pulse-width modulated data, care should also be taken to ensure that the recovery amplitude $I_R$ of the wavelength recovery portion is below the threshold lasing current of the semiconductor laser or sufficiently low to recover the wavelength.

It is also noted that the wavelength recovery signal does not need to be implemented on a regular, periodic basis. Rather, the recovery signal can be applied as-needed. For example, if a wavelength drift exceeding an acceptable value is detected, e.g., more than one cavity mode spacing, a wavelength recovery operation can be implemented by superimposing a wavelength recovery signal on the drive current, forcing the laser to choose a new wavelength.

In terms of frequency of the recovery period, it generally needs to be frequent enough to limit the wavelength variation between two recovery periods to an acceptable amplitude. The ideal frequency and approach depends on the particular demands associated with the application in which the laser is utilized. Also, by performing recovery at the highest possible frequency compatible with the electronics and laser speed any noise in the image will occur at a higher spatial frequency, making the noise harder to detect.

As an example, for laser projection, it may be preferable to initiate recovery periods randomly or synchronize recovery periods with the image pixel generation to avoid any aliasing problem between the data content, i.e., the image, and the recovery signal. Initiating the recovery periods randomly will prevent periodic image defects from occurring line to line by ensuring that the recovery period does not occur at the same location in each image line, but occurs instead at varying locations.

In a further example, periodic image defects caused by the recovery period occurring at the same location in the lines of each frame may be prevented by selecting the recovery period such that the duration of the image line is not an integer multiple of the recovery period, or in other words, such that recovery occurs at a frequency that is not an integer multiple of the line frequency. This will also ensure that the recovery period always occurs at varying locations, thereby making the image defect difficult for the human eye to detect.

Figure 2:
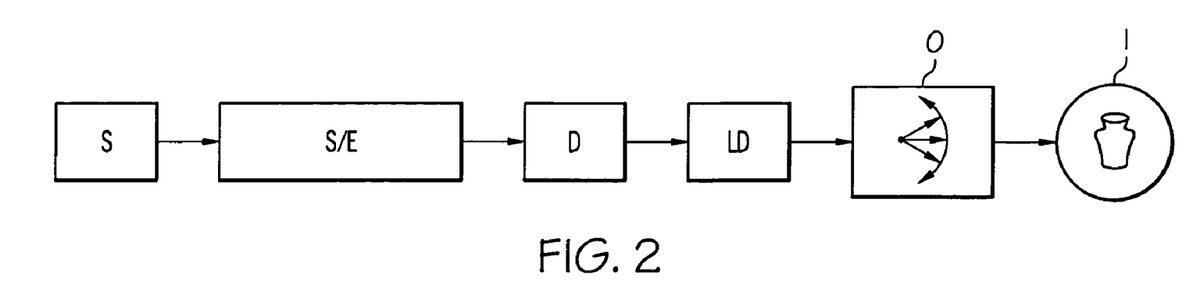
FIG. 2 is a schematic illustration of a laser projection system according to one embodiment of the present invention.

Referring to the laser projection system illustrated schematically in FIG. 2, it is noted that the drive current control schemes according to particular embodiments of the present invention may be executed in a variety of forms within the system. For example, and not by way of limitation, the wavelength recovery portion of the drive current may be executed by integrating the recovery portion into the video signal during rendering by the projection software and electronics. In this approach pixels distributed throughout the image would be altered by the wavelength recovery signal independent of the required intensity from the source image. The frequency of this interruption should be chosen to minimize the impact on the human eye, and on perceived optical power. Alternatively, the wavelength recovery portion of the drive signal may be integrated into the laser driver electronics. In this approach, the drive signal, which is derived from the image stream, would be periodically overridden by the wavelength recovery signal prior to current scaling. Again, the frequency and duty cycle of this interruption should be chosen to minimize the impact on the human eye, and on perceived optical power. As a further alternative, the drive current to the laser could be periodically shunted, or otherwise reduced, to reduce or modify the drive current independent of the desired intensity level.

It is contemplated that FIGS. 5 and 6 illustrate a laser operation scheme that may be used to reduce noise in a single mode laser signal. Further, the scheme of FIGS. 5 and 6 may be used in systems incorporating one or more single mode lasers. For example, as is described in further detail below, it is contemplated that the scheme of FIGS. 5 and 6 may be used in a scanning laser image projection systems incorporating one or more single mode lasers. It is also noted that reference herein to single mode lasers or lasers configured for single mode optical emission should not be taken to restrict the scope of the present invention to lasers that operate in a single mode exclusively. Rather, the references herein to single mode lasers or lasers configured for single mode optical emission should merely be taken to imply that lasers contemplated according to particular embodiments of the present invention will be characterized by an output spectrum where a single mode of broad or narrow bandwidth is discernable therein or by an output spectrum that is amenable to discrimination of a single mode there from through suitable filtering or other means.

It is contemplated that the relative magnitudes of the drive duration $t_D$ and the recovery duration $t_R$ should be controlled to preserve an optimal degree of laser efficiency while ensuring adequate wavelength recovery. For example, according to one aspect of the present invention, at least about 80% of a duty cycle of the drive signal is occupied by the drive duration $t_D$ and less than about 20% of a duty cycle of the drive signal is occupied by the recovery duration $t_R$. In many instances, it will be sufficient to ensure that the recovery duration $t_R$ is less than about 10 ns, perhaps shorter than about 5 ns. Additionally control schemes are contemplated where at least about 95% of the duty cycle of the drive signal is occupied by the drive duration $t_D$ and less than about 5% of the duty cycle is occupied by the recovery duration $t_R$. In cases where the electric circuitry controlling the drive signal is sufficiently responsive, adequate control schemes are contemplated where at least about 97.5% of the duty cycle of the drive signal is occupied by the drive duration $t_D$ and less than about 2.5% of the duty cycle is occupied by the recovery duration $t_R$.

Additional considerations need to be accounted for when establishing the respective values of the drive duration $t_D$ the recovery duration $t_R$ in the context of laser projection systems. For example, and not by way of limitation, the laser projection system illustrated in FIG. 2 comprises an image source S generating a single or multi-color image data stream, image projection software and associated electronics S/E for generating a laser drive signal D for each primary image color, a laser driver LD generating respective laser drive currents for individual lasers configured to generate each primary image color, and scanning and projection optics O that operate to generate a single or multi-color projected image I comprising an array of image pixels. Each of the image pixels in this and other types of scanning laser image projecting systems is characterized by an active pixel duration $t_P$. For example, and not by way of limitation, the active pixel duration of a pixel in the image may be 40 nsec or less. Generally, the recovery duration $t_R$ will be less than the pixel duration $t_P$. Preferably, the recovery duration $t_R$ is at least 50% less than the pixel duration $t_P$. In contrast, the drive duration $t_D$ may be greater than, less than, or equal to the pixel duration $t_P$, depending upon the preferences of the system designer.

Those skilled in the art will recognize that the active pixel duration $t_P$ may vary modestly and periodically across the image as a result of scanning speed variations. Accordingly, reference to a projecting system that is "characterized by an active pixel duration" should not be taken to denote that each pixel in an image has the same pixel duration. Rather, it is contemplated that individual pixels within the display may have different pixel durations that each fall under the general concept of a display characterized by an active pixel duration $t_P$.

A multi-tone image can be generated by the image projection system by configuring the image projection electronics and the corresponding laser drive currents to establish a pixel intensity that varies across the array of image pixels. In this case, the wavelength recovery portion of the drive current is superimposed upon the signal that encodes the varying pixel intensity. Further detail concerning the configuration of scanning laser image projection systems and the manner in which varying pixel intensities are generated across an image is beyond the scope of the present invention and may be gleaned from a variety of readily available teachings on the subject.

The present inventors have recognized that semiconductor lasers commonly exhibit a temperature evolution signature that can create unfavorable patterning in the output of the laser and the output of a wavelength conversion device coupled to the laser. This unfavorable patterning can create significant problems in the context of the laser projection systems described above. Accordingly, the present invention also contemplates phase altering scheme for disrupting the temperature evolution signature of a semiconductor laser or otherwise controlling lasing wavelength of a semiconductor laser.

Figure 9:
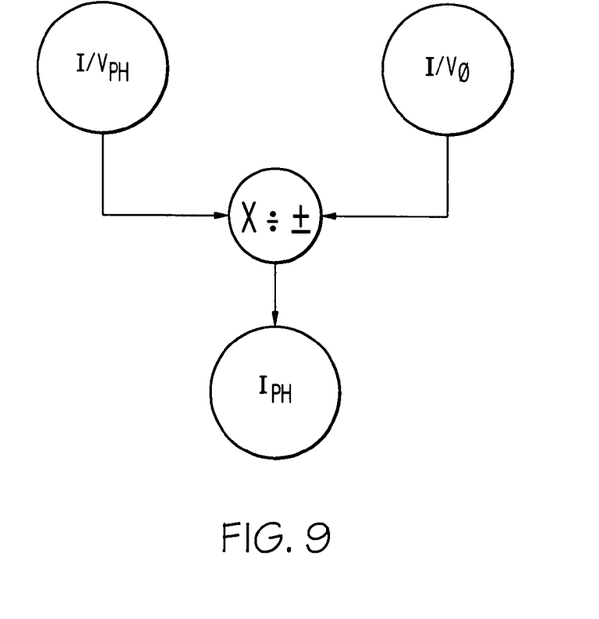
FIG. 9 illustrates a scheme for disrupting the unfavorable temperature evolution signature of a semiconductor laser.

Referring initially to FIGS. 1 and 9, it is noted that one embodiment of the present invention utilizes a phase shifting signal $I/V_\Phi$ to modify the drive signal $I/V_{PHASE}$ that is used to control the phase section 14 of a semiconductor laser 10 comprising, for example, a wavelength selective section 12, a phase section 14, and a gain section 16. As illustrated in FIG. 9, the modification of the drive signal $I/V_{PHASE}$ can be executed using multiplication, division, summation, or combinations thereof, but it is contemplated that any suitable algorithm or modification process may be used in conjunction with the phase shifting signal $I/V_\Phi$. The phase shifting signal $I/V_\Phi$ and the drive signal $I/V_{PHASE}$ can be voltage or current-based control signals, depending on the structure of the semiconductor laser, and can be applied to the phase section 14 of a semiconductor laser 10 with the use of microheaters in thermal communication with the phase section 14, via direct electrical current injection into the phase section 14, or by applying a suitable voltage to the phase section 14.

Generally, the phase shifting signal $I/V_\Phi$ is selected to disrupt systematic wavelength variations in the optical emission of the semiconductor laser. More specifically, the phase shifting signal $I/V_\Phi$ disrupts the systematic wavelength variations by shifting the phase of the laser by one half of the free spectral range from a unshifted state to a shifted state, thereby altering mode selection in the semiconductor laser 10. For example, in a laser projection system where a static image is displayed, phase shifting may be utilized to disrupt the systematic image defects in the image. More specifically, if one pixel of the image which corresponds to the scenario of FIG. 7, the cavity mode is centered over the PPLN curve and the pixel is brightest. However, if when displaying the next frame the phase has been shifted by half a free spectral range, then all bright pixels corresponding to the scenario of FIG. 7 become darker pixels corresponding to the scenario of FIG. 8. Therefore, by changing the phase by half of a free spectral range over a frame per frame basis, an image is displayed with a given brighter artifact followed by an image with a complementary darker artifact. When averaging over time, the defect then disappears. This principle can be applied over a frame-per-frame, line-per-line or pixel-per-pixel basis.

When using the RZ modulation techniques described herein, in many instances the laser cavity mode gets selected every time the laser is reset and the laser wavelength keeps changing without mode hopping between two resetting operations. Accordingly, although the phase shifting methods described above are typically executed on a frame-per-frame, line-per-line, or pixel-per-pixel basis, it is contemplated that it may also be advantageous to synchronize the phase shifting signal with the laser resetting operations.

Figure 10:
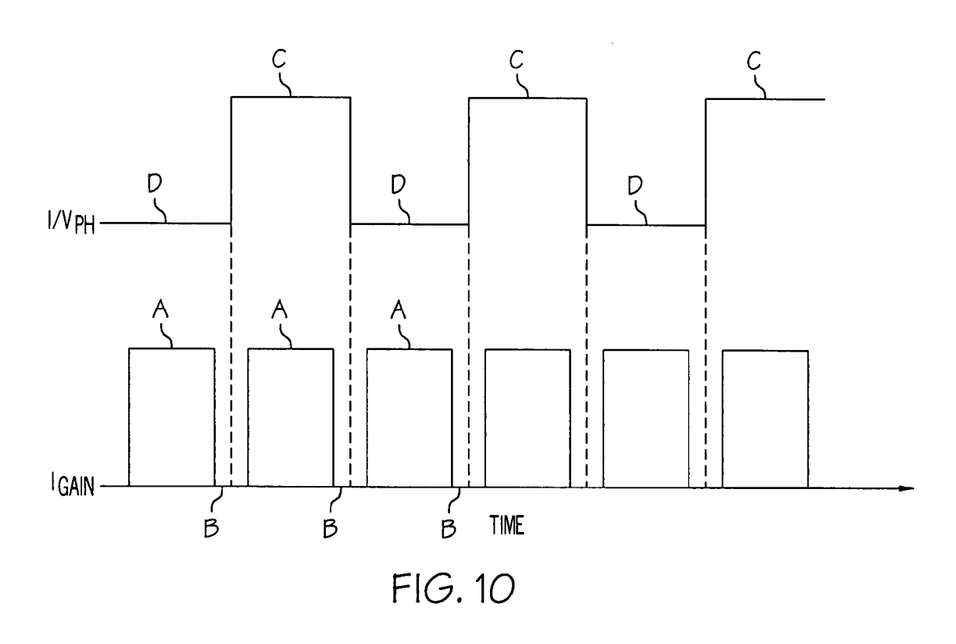
FIG. 10 illustrates an example of a phase shifting signal profile for use in the scheme illustrated in FIG. 9.

FIG. 10 illustrates a phase shifting signal $I/V_\Phi$ as a square wave that is synched with the wavelength recovery portions in accordance to one embodiment of the present invention. The amplitude profile of the phase shifting signal $I/V_\Phi$ comprises a plurality of mode shifting segments C and basal phase control segments D. The drive current $I_{GAIN}$ comprises wavelength recovery portions B that are interposed temporally between the data portions A. The wavelength recovery portions may occur at a wavelength recovery frequency as illustrated in FIG. 10, or may occur randomly in time. According to one embodiment of the present invention, the phase shifting signal $I/V_\Phi$ is synched with the wavelength recovery portions B at half the wavelength recovery frequency. More specifically, the phase shifting signal $I/V_\Phi$ transitions between the mode shifting segment C and the basal phase control segment D during one of the plurality of wavelength recovery portions A in the drive current $I_{GAIN}$. This technique insures that each brighter pixel is followed by a darker one, thereby making the image artifacts averaged in space to disappear. Although FIG. 10 illustrates wavelength recovery portions occurring at a determined frequency, it is contemplated that the wavelength recovery portions may occur randomly in time. Alternatively, the phase shifting signal $I/V_\Phi$ may transition independent of the wavelength recovery portion, such as before, during or after each image line duration $t_L$ or each image frame duration $t_F$.

The amplitude of the mode shifting segments C is greater than the amplitude of the basal phase control segments D and is configured such that the mode shifting segments C shifts the cavity modes by one half of the free spectral range of the laser during a wavelength recovery portion. Conversely, the amplitude of the basal phase control signal D is configured such that the cavity modes are maintained in a natural state, or are shifted back to a natural state during a wavelength recovery portion following a mode shifting segment C.

By adding the square modulation to the thermal drift of the cavity modes, the mode selection gets modified. The cavity modes are shifted back and forth by plus or minus one half of the free spectral range of the laser. Therefore, the image defects created by either a centered and aligned cavity mode (FIG. 7), or symmetrical cavity modes (FIG. 8) are avoided because the cavity modes are shifted between the two situations at each wavelength recovery portion. In other words, the cavity modes are shifted back and forth, preventing either extreme situation from occurring within subsequent data portions. This results in a dithering that disrupts the systematic image defect and is difficult for the human eye to detect.

As an example, and not by way of limitation, when the cavity modes get close to the DBR wavelength, the wavelength oscillates between the highest power (the cavity modes aligned on the DRB curve) and the lowest power (cavity modes misaligned by one half of the free spectral range). Therefore, the fluctuation of the power averaged over two adjacent pixels gets reduced and any image defects are harder to detect. The present inventors have found that the fluctuation of power between pixels is reduced from 8% to 2%. Additionally, image noise, which is the standard deviation calculated for each pixel of the image over many identical image frames, was found to be around 7% when using some embodiments of the present invention. Another advantage of the present invention is that the wall plug efficiency of the laser is improved. By sending a square-wave signal into the phase section rather than providing a high current injection, the power applied to the phase section is reduced. For example and by illustration, not limitation, one embodiment of the present invention requires only 90 mW of power into the phase section.

Although the present invention has been described with primary reference to pixel-based projection systems, it is contemplated that other projection systems, such as spatial light modulator based systems (including digital light processing (DLP), transmissive LCD, and liquid crystal on silicon (LCOS)), incorporating laser-based light sources may benefit from the wavelength stabilization and perturbation techniques described herein. In these other systems the relevant period exogenous to the laser is not the pixel period but the inverse of the screen refresh rate, or a fraction thereof. In these cases the input signal to the laser will be characterized by an encoded data period $t_P$ and the drive current will be configured such that the recovery duration $t_R$ of the wavelength recovery portion is less than the encoded data period $t_P$.

Reference is made throughout the present application to various types of currents. For the purposes of describing and defining the present invention, it is noted that such currents refer to electrical currents. Further, for the purposes of defining and describing the present invention, it is noted that reference herein to "control" of an electrical current does not necessarily imply that the current is actively controlled or controlled as a function of any reference value. Rather, it is contemplated that an electrical current could be controlled by merely establishing the magnitude of the current.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

For example, although the control schemes described herein relate to the incorporation of a wavelength recovery portion in a drive current applied to a gain section or wavelength selective DBR section of a semiconductor laser, it is contemplated that methods of incorporating the wavelength recovery operation in a laser operating scheme are not limited to drive currents applied to only these portions of a laser. For example, and not by way of limitation, the laser may include a recovery portion that is configured to absorb photons when a recovery signal is applied thereto. In which case, the recovery portion can be used to decrease photon density as needed, in a manner similar that which is employed for the gain and DBR sections described herein.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation. e.g., "substantially above zero," varies from a stated reference, e.g., "zero," and should be interpreted to require that the quantitative representation varies from the stated reference by a readily discernable amount.

What is claimed is:

1. A method of controlling a laser projection system comprising a visible light source, wherein the visible light source comprises a semiconductor laser and a wavelength conversion device, the method comprises: generating at least a portion of a scanned laser image by configuring the semiconductor laser for optical emission of encoded image data and scanning an output beam of the visible light source across a plurality of image pixels or encoded data periods, the semiconductor laser comprising a gain section, a phase section and a wavelength selective optical element; and applying a phase shifting signal $I/V_\Phi$ to the phase section of the semiconductor laser to periodically shift a plurality of cavity modes between an unshifted state and a shifted state, wherein the unshifted state and the shifted state are separated by approximately one half of the laser cavity free spectral range; wherein the method further comprises applying a drive signal $I_{GAIN}$ into the gain section of the semiconductor laser, the drive signal $I_{GAIN}$ comprising a plurality of data portions and corresponding wavelength recovery portions interposed temporally between corresponding data portions, wherein the data portions comprise respective drive amplitudes $I_D$ and drive durations $t_D$, and the wavelength recovery portions comprise recovery amplitudes $I_R$ distinct from the drive amplitudes $I_D$ of the data portions and recovery durations $t_R$ less than the drive durations $t_D$ of the data portion.

2. A method as claimed in claim 1 wherein the phase shifting signal $I/V_\Phi$ shifts the cavity modes at a frequency approximately equal to or less than an image pixel generation frequency defined by the laser projection system.

3. A method as claimed in claim 1 wherein: the wavelength recovery portions occur at a frequency that is approximately equal to or less than an image pixel generation frequency defined by the laser projection system; and the frequency of the phase shifting signal $I/V_{\Phi}$ is synched at half the frequency of the wavelength recovery frequency, wherein the shifting of the plurality of cavity modes is synchronized with the wavelength recovery portions.

4. A method as claimed in claim 3 wherein:
the plurality of image pixels or encoded data periods are arranged to define an image frame comprising a plurality of image lines, each image frame occurring at an image frame generation frequency;

the wavelength recovery portions occur at a frequency that is approximately equal to or less than an image pixel generation frequency defined by the laser projection system; and the phase shifting signal $I/V_\Phi$ shifts the cavity modes at a frequency approximately equal to the image frame generation frequency.

5. A method as claimed in claim 4 wherein:

the plurality of image pixels or encoded data periods are arranged to define an image frame comprising a plurality of image lines, each image line occurring at an image line generation frequency;

the wavelength recovery portions occur at a frequency that is approximately equal to or less than an image pixel generation frequency defined by the laser projection system; and the phase shifting signal $I/V_\Phi$ shifts the cavity modes at a frequency approximately equal to the image line generation frequency.

6. A method as claimed in claim 1 wherein: the wavelength recovery portions occur at random intervals in the drive signal $I_{GAIN}$; and the frequency of the phase shifting signal $I/V_\Phi$ is synched with the wavelength recovery portions.

7. A method as claimed in claim 1 wherein the wavelength recovery portions are initiated such that the wavelength recovery portions occur at varying locations in a set of image lines defined by the laser projection system.

8. A method as claimed in claim 7 wherein the wavelength recovery portions are initiated randomly.

9. A method as claimed in claim 7 wherein the wavelength recovery portions occur at a frequency that is not an integer multiple of an image line generation frequency.

10. A method as claimed in claim 1 wherein:

the plurality of image pixels or encoded data periods are arranged to define an image frame comprising a plurality of image lines;

each image line occurs at an image line generation frequency; and each image frame occurs at an image frame generation frequency.

11. A method as claimed in claim 10 wherein the phase shifting signal $I/V_\Phi$ shifts the cavity modes at a frequency approximately equal to the image frame generation frequency.

12. A method as claimed in claim 10 wherein the phase shifting signal $I/V_\Phi$ shifts the cavity modes at a frequency approximately equal to the image line generation frequency.

13. A method as claimed in claim 1 wherein the phase shifting signal $I/V_\Phi$ is applied to the phase section such that it alternates between a mode shifting segment and a basal phase control segment.

14. A method as claimed in claim 13 wherein the phase shifting signal $I/V_\Phi$ is configured as a square wave.

15. A method as claimed in claim 13 wherein the amplitude of the mode shifting segment is greater than the amplitude of the basal phase control segment.

16. A method as claimed in claim 13 wherein the phase shifting signal $I/V_\Phi$ is applied to the phase section such that it transitions between the high-amplitude mode shifting segment and the low-amplitude basal phase control segment during one of the plurality of wavelength recovery portions in the drive current $I_{GAIN}$.

17. A method as claimed in claim 13 wherein the respective amplitudes of the high-amplitude mode shifting segment and the basal phase control segment are selected to alter mode selection by one half of the free spectral range of the semiconductor laser when the phase shifting signal $I/V_\Phi$ transitions between the high-amplitude mode shifting segment and the low-amplitude basal phase control segment.

18. A method as claimed in claim 13 wherein the respective amplitudes of the high-amplitude mode shifting segment and the basal phase control segment are selected such that the high-amplitude mode shifting segment and the basal phase control segment alter mode selection in the semiconductor laser between an aligned emission mode that is approximately aligned with the distributed Bragg reflector wavelength and one of two misaligned emission modes that are misaligned relative to the distributed Bragg reflector wavelength by approximately one half the free spectral range of the semiconductor laser.

19. A method as claimed in claim 1 wherein:

a drive signal $I/V_{PHASE}$ is applied to the phase section of the semiconductor laser to control the wavelength of the plurality of laser cavity modes; and the additional drive signal $I/V_{PHASE}$ is modified by the phase shifting signal $I/V_\Phi$ using multiplication, division, summation, or combinations thereof.

20. A method as claimed in claim 1 wherein at least a portion of a scanned laser image is generated by using a wavelength converting device to convert an optical signal from the semiconductor laser into higher harmonic waves.

21. A method of controlling a laser projection system comprising a visible light source, wherein the visible light source comprises a semiconductor laser and a wavelength conversion device, the method comprises:

generating at least a portion of a scanned laser image by configuring the semiconductor laser for optical emission of encoded image data and scanning an output beam of the visible light source across a plurality of image pixels or encoded data periods that are arranged to define an image frame comprising a plurality of image lines with each line being characterized by an image line duration $t_L$ and image frame duration $t_F$, the semiconductor laser comprising a gain section, a phase section and a wavelength selective optical element; and applying a phase shifting signal $I/V_\Phi$ to the phase section of the semiconductor laser to periodically shift a plurality of cavity modes between an unshifted state and a shifted state at the initiation of each image line duration $t_L$ or the initiation of each image frame duration $t_F$, wherein the unshifted state and the shifted state are separated by approximately one half of the laser cavity free spectral range.

22. A method of controlling a laser projection system comprising a visible light source, wherein the visible light source comprises a semiconductor laser and a wavelength conversion device, the method comprises:

generating at least a portion of a scanned laser image by configuring the semiconductor laser for optical emission of encoded image data and scanning an output beam of the visible light source across a plurality of image pixels or encoded data periods, the semiconductor laser comprising a gain section, a phase section and a wavelength selective optical element; and applying a drive signal $I_{GAIN}$ into the gain section of the semiconductor laser, the drive signal $I_{GAIN}$ comprising a plurality of data portions and corresponding wavelength recovery portions interposed temporally between corresponding data portions, wherein the data portions comprise respective drive amplitudes $I_D$ and drive durations $t_D$, the wavelength recovery portions comprise recovery amplitudes $I_R$ distinct from the drive amplitudes $I_D$ of the data portions and recovery durations $t_R$ less than the drive durations $t_D$ of the data portion, and the wavelength recovery portions are initiated such that the wavelength recovery portions occur at varying locations in a set of image lines defined by the laser projection system.

23. A method as claimed in claim 22 wherein the wavelength recovery portions are initiated randomly.

24. A method as claimed in claim 23 wherein the wavelength recovery portions occur at a frequency that is not an integer multiple of an image line generation frequency.

* * * * *